(12) United States Patent
Tokoshima et al.

(10) Patent No.: US 9,129,797 B2
(45) Date of Patent: Sep. 8, 2015

(54) CLEANING METHOD

(75) Inventors: Hiroto Tokoshima, Tokyo (JP); Hiroshi Morita, Tokyo (JP)

(73) Assignee: KURITA WATER INDUSTRIES LTD., Tokyo (JP)

(*) Notice: Subject to any disclaimer, the term of this patent is extended or adjusted under 35 U.S.C. 154(b) by 429 days.

(21) Appl. No.: 13/518,583

(22) PCT Filed: Dec. 21, 2010

(86) PCT No.: PCT/JP2010/072955
§ 371 (c)(1),
(2), (4) Date: Aug. 24, 2012

(87) PCT Pub. No.: WO2011/078144
PCT Pub. Date: Jun. 30, 2011

(65) Prior Publication Data
US 2012/0325927 A1 Dec. 27, 2012

(30) Foreign Application Priority Data
Dec. 24, 2009 (JP) ................................ 2009-292510

(51) Int. Cl.
*H01L 21/02* (2006.01)
*H01L 21/67* (2006.01)
(52) U.S. Cl.
CPC ...... *H01L 21/0206* (2013.01); *H01L 21/02052* (2013.01); *H01L 21/67051* (2013.01)
(58) Field of Classification Search
None
See application file for complete search history.

(56) References Cited

U.S. PATENT DOCUMENTS

| 4,326,553 | A | * | 4/1982 | Hall ............................... 134/153 |
| 6,048,409 | A | | 4/2000 | Kanno et al. |
| 2002/0035762 | A1 | * | 3/2002 | Okuda et al. ...................... 15/77 |
| 2006/0249182 | A1 | | 11/2006 | Hayamizu et al. |
| 2008/0156356 | A1 | * | 7/2008 | Nagasaka et al. ......... 134/115 R |
| 2008/0308132 | A1 | | 12/2008 | Tomita et al. |

FOREIGN PATENT DOCUMENTS

| JP | 11077023 A | * | 3/1999 |
| JP | 2001-345301 A | | 12/2001 |
| JP | 2001345301 A | * | 12/2001 |
| JP | 2002-151459 A | | 5/2002 |
| JP | 2004-296463 A | | 10/2004 |
| TW | 423068 B | | 2/2001 |
| TW | 200830387 A | | 7/2008 |
| TW | 200903603 A | | 1/2009 |
| TW | 200927914 A | | 7/2009 |

OTHER PUBLICATIONS

English Machine Translation of JP 2001-345301 A.*
English Machine Translation of JP 11-077023 A.*

* cited by examiner

Primary Examiner — Nicole Blan
(74) Attorney, Agent, or Firm — Manabu Kanesaka

(57) ABSTRACT

Disclosed is a low-cost and resource-saving cleaning method wherein high cleaning effects are obtained by high-pressure jet cleaning or two-fluid cleaning using a gas-dissolved water. In the high-pressure jet cleaning method or the two-fluid cleaning method, a cleaning liquid or a mixed fluid of the cleaning liquid and a gas is jetted from a cleaning fluid jetting nozzle toward a subject to be cleaned, and the subject is cleaned. The cleaning liquid introduced into the cleaning fluid jetting nozzle contains the dissolved gas in a quantity equal to or more than the saturation solubility at the liquid temperature of the cleaning liquid.

9 Claims, 1 Drawing Sheet

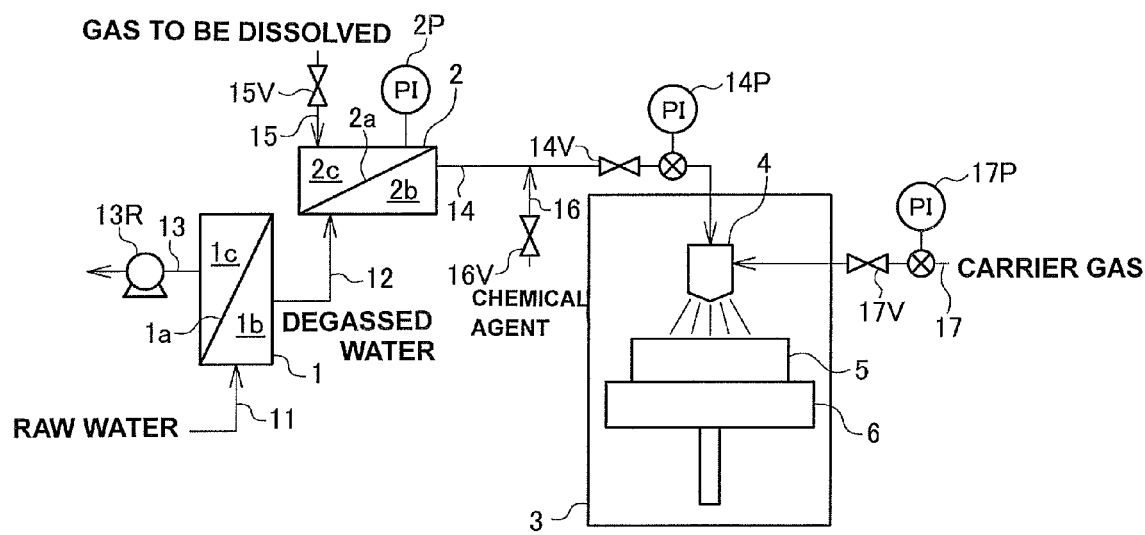

CLEANING METHOD

FIELD OF INVENTION

The present invention relates to a method for effectively cleaning a surface of various kinds of subjects. The cleaning method according to this invention is particularly suitable for cleaning of silicon wafers for semiconductors, glass substrates for flat panel displays, quartz substrates for photomasks, and other electronic materials (e.g., electronic components or electronic elements) that should be of high cleanliness.

BACKGROUND OF INVENTION

A conventional process for removing fine particles, organic matter, metal, and other substances from a surface of electronic materials such as silicon wafers for semiconductors, glass substrates for flat panel displays, and quartz substrates for photomasks is the so-called RCA cleaning process, which is a high-temperature wet cleaning process that uses concentrated chemical agent solutions including mainly hydrogen peroxide. The RCA cleaning process is effective for removing metal and other substances on a surface of an electronic material. As the RCA cleaning process uses a large amount of treating liquid containing acid, alkali, or hydrogen peroxide at a high concentration, waste water discharged from the process contains them. Such waste water is required to be treated by neutralization, segmentation or the like which needs a high cost and produces a large amount of sludge.

Gas-dissolved water prepared by dissolving a gas in pure water and optionally adding a slight amount of a chemical agent, has come to be used instead of the above treating liquid. Cleaning with gas-dissolved water is less problematic in terms of chemical agent residues left on the cleaned subject, and also has high cleaning effect and thus reduces the amount of water used for cleaning.

The gases that are used for gas-dissolved water to be used as cleaning water for electronic materials include hydrogen gas, oxygen gas, ozone gas, rare gas, carbon dioxide gas, and so forth.

Known cleaning methods include high-pressure jet cleaning, in which a cleaning liquid is jetted from a nozzle at a high pressure, two-fluid cleaning, in which a cleaning liquid and a gas (carrier gas) are jetted from a two-fluid nozzle, and so forth. A high-pressure jet cleaning process or a two-fluid cleaning process produces a satisfactory cleaning effect due to physical action of droplets of the cleaning liquid jetted from the nozzle and colliding with the subject at a high speed.

The cleaning effect of gas-dissolved water is admittedly higher than the cleaning effect of water containing no dissolved gases, but fine particles are not fully removed by a high with high-pressure jet cleaning process or a two-fluid cleaning process alone. These cleaning processes obtain high cleaning effect in combination with ultrasonic cleaning. Patent Document 1 proposes a cleaning method containing a process for preparing a cleaning liquid by dissolving hydrogen gas in ultrapure water and adding hydrogen peroxide, and a process for cleaning a subject with the cleaning liquid while irradiating ultrasonic to the cleaning liquid.

However, an ultrasonic cleaning equipment is expensive and thus causes an increased cleaning cost. Furthermore, cleaning glass substrates or the like with gas-dissolved water and ultrasonic requires a large amount of cleaning water, since ultrasonic is irradiated to the substrate using a squall nozzle or the like.

If a sufficient cleaning effect is achieved with a high-pressure jet cleaning process or a two-fluid cleaning process, above-described problems in the ultrasonic cleaning process is solved, and resource-saving cleaning method will be conducted at a low cost. However, the high-pressure jet cleaning process or the two-fluid cleaning process with gas-dissolved water can not achieve a sufficient cleaning effect.

Patent Document 1: Japanese Patent Publication 2004-296463A

OBJECT AND SUMMARY OF INVENTION

An object of the present invention is to provide a low-cost and resource-saving cleaning method by which high cleaning effect can be achieved by high-pressure jet cleaning or two-fluid cleaning with gas-dissolved water.

The present inventors conducted extensive research to achieve the object described above and finally found the following. Once a supersaturated cleaning liquid for a high-pressure jet cleaning process or a two-fluid cleaning process prepared by dissolving a gas therein in a quantity equal to or more than the saturation solubility is jetted and released as cleaning droplets from a nozzle, the gas dissolved therein grows into active bubbles while acting on a surface of a subject to be cleaned. Besides the physical cleaning effect of the cleaning droplets colliding with the surface of the subject, the scrubbing effect of the bubbles, the impact force generated with the collisions of the bubbles, the adsorbing force that works on the gas-liquid boundary, and other physico-chemical cleaning actions are applied to the subject and the sludge materials such as fine particles existing on the surface of the subject. As a result, the gas-dissolved water is enhanced in its cleaning effect including removing fine particles.

The present invention was accomplished on the basis of such findings and the gist thereof is as follows.

[1] A cleaning method by high-pressure jet cleaning or two-fluid cleaning, comprising a step of jetting a cleaning liquid or a mixed fluid of a cleaning liquid and a gas from a jetting nozzle toward a subject to be cleaned and thereby cleaning the subject, wherein the cleaning liquid introduced into the jetting nozzle contains a dissolved gas in a quantity equal to or more than the saturation solubility at the temperature of the cleaning liquid.

[2] The cleaning method according to [1], wherein the dissolved gas is at least one selected from the group consisting of nitrogen gas, oxygen gas, carbon dioxide gas, hydrogen gas, ozone gas, purified air, and rare gas.

[3] The cleaning method according to [1] or [2], wherein the cleaning liquid introduced into the jetting nozzle contains the dissolved gas in a quantity of 1 to 5 times as large as the saturation solubility at the temperature of the cleaning liquid.

[4] The cleaning method according to any one of [1] to [3], wherein the cleaning liquid introduced into the jetting nozzle is prepared by dissolving the gas in pure water or ultrapure water.

[5] The cleaning method according to any one of [1] to [4], wherein the cleaning liquid introduced into the jetting nozzle is prepared by dissolving the gas in degassed water.

[6] The cleaning method according to any one of [1] to [5], wherein the cleaning liquid contains at least one chemical agent selected from the group consisting of alkalis, acids, chelating agents, and surfactants.

Advantageous Effects of Invention

The present invention makes it possible to clean a subject by high-pressure jet cleaning or two-fluid cleaning using gas-dissolved water so that the subject has high cleanliness in a resource-saving, low-cost, and efficient way.

In the present invention, as mentioned above, a gas is dissolved in the cleaning liquid in a quantity equal to or more than the saturation solubility. Once the supersaturated cleaning liquid is jetted and released as cleaning droplets from the nozzle, the gas dissolved therein grows into active bubbles while acting on the surface of the subject to be cleaned. Besides the physical cleaning effect of the cleaning droplets colliding with the surface of the subject, the scrubbing effect of the bubbles, the impact force generated with the collisions of the bubbles, the adsorbing force that works on the gas-liquid boundary, and other physicochemical cleaning actions are applied to the subject and the sludge materials such as fine particles on the surface of the subject. As a result, the gas-dissolved water is enhanced in its cleaning effect including removing fine particles.

In the present invention, the dissolved gas is preferably at least one selected from the group consisting of nitrogen gas, oxygen gas, carbon dioxide gas, hydrogen gas, ozone gas, purified air, and rare gas. These gases for dissolution are preferably dissolved to achieve a degree of oversaturation of 1 to 5 times as high as their own saturation solubility.

The liquid for dissolving the gas therein is preferably pure water or ultrapure water. Considering the gas dissolution efficiency and other factors, it is preferred that the liquid for dissolving the gas therein is degassed.

The cleaning liquid used in the present invention may contain at least one chemical agent selected from the group consisting of alkalis, acids, chelating agents, and surfactants. The presence of these kinds of chemical agents will lead to a further improved cleaning effect.

BRIEF DESCRIPTION OF DRAWINGS

FIG. 1 is a system diagram that illustrates a cleaning apparatus suitable for use in an embodiment of the present invention.

DESCRIPTION OF EMBODIMENTS

The following details an embodiment of the cleaning method according to the present invention.

[Subject to be Cleaned]

There is no particular limitation on the subject cleaned by the cleaning method according to the present invention; however, the present invention offers excellent cleaning effect and thus is suitable for cleaning electronic materials (e.g., electronic components or electronic elements) that should be of high cleanliness including silicon wafers for semiconductors, glass substrates for flat panel displays, quartz substrates for photomasks, or the like.

[Cleaning Liquid]

The cleaning liquid used in the present invention contains a dissolved gas in a quantity equal to or more than the saturation solubility at a temperature of the cleaning liquid. It should be noted that the cleaning liquid refers to the liquid introduced into the jetting nozzle described later.

Any amount of the dissolved gas in the cleaning liquid less than the saturation solubility leads to a failure to produce the excellent cleaning effect intended in the present invention.

An increased amount of the dissolved gas in the cleaning liquid generally results in an enhanced cleaning effect as long as it is equal to or more than the saturation solubility. However, too large amount of the dissolved gas is impractical because a pressurizer or the like becomes too large. Thus, the amount of the dissolved gas in the cleaning liquid is preferably in a range of 1 to 5 times as large as the saturation solubility, in particular, 1 to 3 times, and especially 1.5 to 3 times.

A magnification factor of the amount of a dissolved gas relative to the saturation solubility is referred to as the saturation factor hereinafter. For example, "a saturation factor of 1" means that the amount of the dissolved gas is equal to the saturation solubility, "a saturation factor of 2" means that the amount of the dissolved gas is twice as large as the saturation solubility, and "a saturation factor of 3" means that the amount of the dissolved gas is three times as large as the saturation solubility.

Nonlimitative examples of the gas dissolved in the cleaning liquid include nitrogen gas, oxygen gas, carbon dioxide gas, hydrogen gas, ozone gas, purified air, or rare gas such as argon gas. Only one kind or two or more kinds of gases may be dissolved in the cleaning liquid. When two or more kinds of gases are dissolved in the cleaning liquid, it is enough that at least one of them is present in a quantity equal to or more than its saturation solubility.

The method of dissolving the gas or gases in the liquid in an amount equal to or more than the saturation solubility is not particularly limited. A method using a gas-dissolving membrane module can be employed where the gas is compressed and supplied to a gas-phase room of the gas-dissolving membrane module and dissolved in the liquid in a liquid-phase room thereof.

Usually, the liquid (hereinafter sometimes referred to as "the raw water") in which the gas or gases are dissolved to prepare the cleaning liquid is pure water or ultrapure water having enough purity to clean the subject to desired cleanliness.

When preparing cleaning liquid that contains only the gas or gasses described above, it is preferred that the raw water is degassed water. The degassed water allows the gas to be dissolved easily in a quantity equal to or more than the saturation solubility.

The degree of degassing is preferably equal to or higher than 80%, desirably equal to or higher than 90%.

The raw water may not degassed.

The raw water may be degassed by a degassing membrane module as described later herein.

The raw water may contain one or more chemical agents including alkali agents such as ammonia, sodium hydroxide, potassium hydroxide, and tetramethylammonium hydroxide; acids such as hydrogen fluoride, hydrogen chloride, and sulfuric acid; chelating agents; and surfactants to improve cleaning functionality thereof. The addition of an alkali agent such as ammonia that adjusts the pH of the cleaning liquid to an alkaline value of higher than 7 preferably 9 to 14 improves cleaning effect for removing fine particles or the like. An alkaline gas may be used for adjusting pH instead of an alkaline solution. An ammonia solution is preferable for adjusting pH since it is easy to handle and its concentration can be easily controlled. The cleaning liquid provides a satisfactory cleaning effect when it contains ammonia at a concentration equal to or higher than 1 mg/L preferably 1 to 200 mg/L, and has a pH of 7 to 11. When a pH of the cleaning liquid is too high or an amount of ammonia added is too large, the subject to be cleaned may be damaged. The additive amount of ammonia may be in a range of 1 to 20 mg/L.

The addition of the chemical agent or agents such as ammonia to the raw water may be after the gas is dissolved or before it is dissolved.

[Method for Cleaning Subject]

In the cleaning method according to the present invention, the cleaning liquid described above is used to clean the subject by high-pressure jet cleaning or two-fluid cleaning.

The temperature of the cleaning liquid in this high-pressure jet cleaning or two-fluid cleaning process can be in a range of 10 to 90° C. However, the present invention offers excellent cleaning effect even with a cleaning liquid at room temperature, and thus the temperature of the cleaning liquid is preferably room temperature.

When the present invention is applied to high-pressure jet cleaning, typical jetting conditions for jetting the cleaning liquid from the jetting nozzle are as follows.

Supply of the cleaning liquid: 0.5 to 30 L/min
Liquid pressure at the nozzle: 5 to 20 MPa When the present invention is applied to two-fluid cleaning, the gas (carrier gas) can be one or more kinds selected from nitrogen gas, oxygen gas, carbon dioxide gas, ozone gas, argon gas, air, and so forth, and typical jetting conditions for jetting the cleaning liquid and the carrier gas from the jetting nozzle are as follows.

Supply of the cleaning liquid: 0.05 to 0.5 L/min
Liquid pressure at the nozzle: 0.05 to 0.5 MPa
Carrier gas pressure: 0.1 to 0.6 MPa The cleaning duration is usually about 3 to 60 seconds. It depends on the saturation factor of the cleaning liquid used, whether or not any chemical agents have been added, and other cleaning conditions.

[Cleaning Apparatus]

The following describes the cleaning method according to the present invention in detail with reference to FIG. 1, which illustrates a typical cleaning apparatus suitable for use in the implementation of the cleaning method according to the present invention.

In FIG. 1, the numeral 1 indicates a degassing membrane module, 2 indicates a gas-dissolving membrane module, 3 indicates a chamber, 4 indicates a jetting nozzle, 5 indicates a subject to be cleaned, and 6 indicates a turntable.

As illustrated in the drawing, the subject 5 to be cleaned is placed on the turntable 6 located in the chamber 3. Preferably, the chamber 3 has an exhaust port at its bottom. This is for the purpose of preventing the cleaning fluid jetted from the nozzle 4 from swirling up and thereby contaminating the subject 5. Exhausting a gas from the bottom reduces the swirling-up of the cleaning fluid and thereby prevents the contamination of the subject. The method for fixing the subject 5 to be cleaned to the turntable 6 is not particularly limited; however, a method in which the inside of the turntable 6 is evacuated and thereby the subject 5 and the turntable 6 are brought into intimate contact (vacuum chucking) is suitable. In this case, a method can be suitably used in which a spacer made of rubber (e.g., polytetrafluoroethylene) is inserted between the contact surfaces of the turntable 6 and the subject 5 to make a space and produce a vacuum field and thereby the turntable 6 and the subject 5 are brought into intimate contact.

The inside of the degassing membrane module 1 is partitioned by a gas-permeable membrane 1a into a liquid-phase room 1b and a gas-phase room 1c. Likewise, the inside of the gas-dissolving membrane module 2 is also partitioned by a gas-permeable membrane 2a into a liquid-phase room 2b and a gas-phase room 2c.

The types of these gas-permeable membranes 1a and 2a are not particularly limited as long as they do not allow water to pass through and do allow gases to pass through. Examples of the gas permeable membranes include polymer membranes made of polypropylene, polydimethylsiloxane, a polycarbonate-polydimethylsiloxane block copolymer, a polyvinyl phenol-polydimethylsiloxane-polysulfone block copolymer, poly(4-methylpentene-1), poly(2,6-dimethylphenylene oxide), polytetrafluoroethylene, or the like.

Raw-water piping 11 for supplying the raw water is connected to the liquid-phase room 1b of the degassing membrane module 1. The gas-phase room 1c of the degassing membrane module 1 is connected to the inlet port of a vacuum regulator 13R via exhaust piping 13.

The type of the vacuum regulator 13R is not particularly limited; however, one that can take in water vapor like such apparatuses as a water ring vacuum pump or a scroll pump provided with the function of removing water vapor is preferred.

The liquid-phase room 1b of the degassing membrane module 1 and the liquid-phase room 2b of the gas-dissolving membrane module 2 are connected via degassed-water piping 12. The liquid-phase room 2b of the gas-dissolving membrane module 2 is connected with nozzle-feed-water piping 14 for supplying the gas-dissolved water to the jetting nozzle 4, and the gas-phase room 2c is connected with gas supply piping 15 provided with a flow-rate-regulating valve 15V. The gas-phase room 2c has a pressure indicator 2P.

The nozzle-feed-water piping 14 has a nozzle-feed-water flow-rate-regulating valve 14V and a nozzle-feed-water pressure indicator 14P.

When a chemical agent or agents such as ammonia are added to the gas-dissolved water, chemical-agent supply piping 16 provided with a flow-rate-regulating valve 16V is connected to the nozzle-feed-water piping 14; however, the point of the addition of chemical agents is never limited to this as long as it is located upstream from the jetting nozzle 4.

The jetting nozzle 4 is connected with, in addition to the nozzle-feed-water piping 14, carrier-gas supply piping 17 provided with a flow-rate-regulating valve 17V and a pressure indicator 17P, thereby allowing the gas-dissolved water and the carrier gas can be jetted toward the subject 5.

The cleaning apparatus can be used to prepare gas-dissolved water and clean the subject by the following procedure. First, the raw water (pure water or ultrapure water) is supplied to the liquid-phase room 1b of the degassing membrane module 1 via the raw-water piping 11, and the vacuum regulator 13R is activated to reduce the internal pressure of the gas-phase room 1c. This makes the dissolved gases existing in the raw water in the liquid-phase room 1b permeate the gas-permeable membrane 1a, and gas is discharged out of the system via the gas-phase room 1c and the exhaust piping 13. In this way, the raw water is degassed.

In this operation it is preferred that the internal pressure of the gas-phase room 1c is reduced to 10 kPa or lower, in particular, 5 kPa or lower.

The degassed water, which has been degassed in the liquid-phase room 1b as described above, flows into the liquid-phase room 2b of the gas-dissolving membrane module 2 through the degassed-water piping 12. The gas or gases to be dissolved are supplied to the gas-phase room 2c of the gas-dissolving membrane module 2 via the gas supply piping 15. The gas or gases are supplied to the gas-phase room 2c while being controlled at its flow rate by the regulating valve 15V. The gas or gases are supplied to the liquid-phase room 2b through the gas-permeable membrane 2a and dissolved in the raw water (degassed water). When the raw water is degassed water, the amount of the gas or gases dissolved may be determined by calculation from the supply of the gas or gases and the amount of water or by measuring the concentration of the gas or gases on the secondary side of the gas-dissolving membrane module 2 using a densitometer. The amount of the gas or gases dissolved is preferably controlled based on an internal pressure of the gas-phase room 2c measured by the pressure indicator 2P. More specifically, when a situation where a gas soluble in the raw water is in the saturation state at the given water temperature is defined as a saturation factor of 1, a reading of the pressure indicator 2P (gauge pressure) of 0 MPa (≈1 atm) means that the saturation factor of the resulting gas-dissolved water is 1. Like wise, a reading of the pressure indicator 2P of 0.1 MPa means that the saturation factor of the gas-dissolved water is 2, and a reading of the pressure indicator 2P of 0.2 MPa means that the saturation factor of the gas-dissolved water is 3. Therefore, the saturation factor of the gas-dissolved water can be adjusted on the basis of the reading of the pressure indicator 2P.

The reading of the pressure indicator 2P should be lower than that of the nozzle-feed-water pressure indicator 14P. More specifically, the pressure $V_1$ of the gas-phase room 2c of the gas-dissolving membrane module 2 measured by the pressure indicator 2P and the feed-water pressure $V_2$ of the gas-dissolved water measured by the nozzle-feed-water pressure indicator 14P should satisfy the relation $V_1 < V_2$. This is for the purpose of preventing the generation of bubbles in the gas-dissolved water while it is flowing through the feed-water piping 14 to the jetting nozzle 4; therefore, increasing the saturation factor of the gas-dissolved water requires increasing this hydraulic pressure. The value of the nozzle feed-water pressure $V_2$ is preferably about 0.1 to 1 MPa more preferably 0.2 to 0.6 MPa.

The gas-dissolved water, obtained by dissolving a desired gas or gases in the raw water at the gas-dissolving membrane module 2, is subjected to flow-rate adjustment at the nozzle-feed-water flow-rate-regulating valve 14V and delivered to the jetting nozzle 4 via the nozzle-feed-water piping 14.

A chemical agent or agents may be added to the raw water, they are injected to the gas-dissolved water via the chemical-agent supply piping 16. An additive amount thereof is controlled by the chemical-agent flow-rate-regulating valve 14V. Although the chemical-agent injection point is located on the secondary side of the gas-dissolving membrane module 2 in FIG. 1, the point of injection is not limited thereto and it may be on the primary side of the gas-dissolving membrane module 2. A filter (not illustrated in the drawing) may be equipped for improving cleanliness of the cleaning liquid. No limitation is imposed on where to place filters.

The cleaning liquid (gas-dissolved water with or without a chemical agent or agents) and the carrier gas are mixed at the jetting nozzle 4. The carrier gas is supplied to the jetting nozzle 4 via the carrier-gas supply piping 17. The flow rate of the gas is controlled at the carrier-gas flow-rate-regulating valve 17V or the pressure of the gas is controlled with reference to the pressure indicator 17P. The supply pressure of the carrier gas is indicated by the carrier-gas supply-pressure indicator 17P. The carrier-gas supply pressure $V_3$ should be higher than the pressure $V_2$ of the nozzle feed water (i.e., $V_3 > V_2$). The carrier-gas supply pressure $V_3$ is preferably higher than the nozzle-feed-water pressure $V_2$ by approximately 0.1 to 0.2 MPa.

The cleaning fluid prepared at the jetting nozzle 4 as a mixed fluid of the carrier gas and the cleaning liquid is jetted toward the subject 5, and thereby the surface of the subject 5 is cleaned.

During this operation it is preferred that the turntable 6 is rotated at a speed of 1 to 500 rpm, preferably 100 to 300 rpm. This allows for effective cleaning of the surface of the subject 5.

EXAMPLES

The present invention will be further described in detail with reference to examples. However, the present invention is not limited to the following examples as long as not exceeding the gist thereof.

Example 1

A cleaning test was conducted using a cleaning apparatus as shown in FIG. 1 with a contaminated wafer detailed below as a subject to be cleaned.
<Subject Cleaned>
Oxide-coated wafer contaminated by alumina slurry: six-inch silicon wafer contaminated by alumina slurry after treated with ozonated water for hydrophilizing the wafer surface. The number of fine particles (fine particles of 0.12 μm or larger) on the wafer surface after contamination was 6000 to 7000 particles/wafer.

The gas-dissolved water used was oxygen-gas-dissolved water prepared by degassing ultrapure water at the degassing membrane module (the pressure of the gas-phase room of the degassing membrane module was 5 kPa, equivalent to 95% degassing) and dissolving oxygen gas at the gas-dissolving membrane module to achieve a saturation factor of 3 (the pressure of the gas-phase room of the gas-dissolving membrane module was 0.2 MPa, equivalent to a saturation factor of 3).

The nozzle used for cleaning and other cleaning conditions were as follows.
Nozzle: "Air Atomizing Nozzle (B1/4J-SS+SUN23-SS)" manufactured by Spraying Systems Co., Japan
  Supply of gas-dissolved water to the nozzle: 0.4 L/min
  Feed-water pressure at the nozzle: 0.3 MPa
  Carrier gas: $N_2$ gas
  Carrier gas supply pressure: 0.4 MPa
  Turntable rotation speed during cleaning: 100 rpm
  Cleaning duration: 10 seconds
  Drying method: Blowing with nitrogen gas
  Turntable rotation speed during cleaning: 1500 rpm
  Drying duration: 30 seconds
The wafer was cleaned under the above conditions and then the fine particles on the wafer surface were counted, and the removal rate relative to the number of fine particles before cleaning was determined. The result is shown in Table 1.

Comparative Example 1

The contaminated wafer was cleaned and the fine particle removal rate was calculated in the same way as in Example 1 except that the degassed water before the dissolution of oxygen gas was used as cleaning water. The result is shown in Table 1.

Example 2

The contaminated wafer was cleaned and the fine particle removal rate was calculated in the same way as Example 1 except that cleaning water was prepared by adding ammonia to the oxygen-gas-dissolved water at a concentration of 1 mg/L (pH 9.4). The result is shown in Table 1.

Comparative Example 2

The contaminated wafer was cleaned and the fine particle removal rate was calculated in the same way as Example 2 except that cleaning water was prepared by adding ammonia to the degassed water at a concentration of 1 mg/L and not dissolving oxygen gas. The result is shown in Table 1.

Examples 3 to 6

The contaminated wafer was cleaned and the fine particle removal rate was calculated in the same way as Example 1 except that the pressure of the gas-phase room of the gas-dissolving membrane module was adjusted so that the saturation factor of the oxygen-gas-dissolved water corresponded to the value specified in Table 1, respectively. The results are shown in Table 1.

Comparative Example 3

The contaminated wafer was cleaned and the fine particle removal rate was calculated in the same way as in Example 1 except that the pressure of the gas-phase room of the gas-dissolving membrane module was adjusted to reduce the amount of dissolved oxygen gas in the oxygen-gas-containing gas-dissolved water below the saturation solubility, to ½ of the saturation solubility (referred to as "a saturation factor of ½"). The result is shown in Table 1.

TABLE 1

| | Oxygen gas saturation factor of cleaning water | Fine particle removal rate (%) | Remarks |
|---|---|---|---|
| Example 1 | 3 | 93 | |
| Example 2 | 3 | 97 | Ammonia added |
| Example 3 | 1 | 90 | |
| Example 4 | 1.5 | 92 | |
| Example 5 | 2 | 93 | |
| Example 6 | 4 | 94 | |
| Comparative Example 1 | — | 89 | |
| Comparative Example 2 | — | 93 | Ammonia added |
| Comparative Example 3 | ½ | 90 | |

The comparison between Example 1 and Comparative Example 1 shows that using the cleaning water containing the carrier gas in a quantity equal to or more than the saturation solubility makes it possible to achieve a satisfactory cleaning effect in the two-fluid cleaning process.

Furthermore, the comparison between Example 2 and Comparative Example 2 shows that using the cleaning water containing the carrier gas in a quantity equal to or more than the saturation solubility improves the cleaning effect even when a cleaning chemical agent such as ammonia is used.

In addition, the comparisons between Examples 1 and 3 to 6 and Comparative Example 3 show that it is preferred that the saturation factor of the gas-dissolved water is in a range of 1 to 5, in particular, 1.5 to 3, and reveals that increasing the saturation factor beyond 3 makes no great difference to the cleaning effect.

Although the present invention is herein detailed on the basis of a particular embodiment, it will be understood by those skilled in the art that various changes are possible without departing from the spirit and scope of the present invention.

The present invention is based on a Japanese patent application filed on Dec. 24, 2009 (Japanese Patent Application No. 2009-292510), entire contents of which are incorporated herein by reference.

The invention claimed is:

1. A cleaning method by high-pressure jet cleaning or two-fluid cleaning, comprising:
   a step of jetting a cleaning liquid or a mixed fluid of the cleaning liquid and a carrier gas from a jetting nozzle toward a subject of an electronic material to be cleaned and thereby cleaning the subject,
   wherein the cleaning liquid is at room temperature,
   the cleaning liquid introduced into the jetting nozzle contains a dissolved gas prepared by dissolving a gas in degassed water with a gas-dissolving membrane module in a quantity of 1.5 to 3 times as large as a saturation solubility at a temperature of the cleaning liquid,
   a pressure in a feed water piping connecting the gas-dissolving membrane module and the jetting nozzle is controlled thereby to prevent generation of bubbles in the cleaning liquid,
   the gas is supplied to a gas-phase room of the gas-dissolving membrane module through a gas supply piping having a gas flow regulating valve,
   the gas-phase room has a first pressure indicator measuring a pressure $V_1$ in the gas-phase room,
   the feed water piping has a feed water regulating valve and a second pressure indicator measuring a water feed pressure $V_2$ at a downstream side relative to the feed water regulating valve, and
   $V_1 < V_2$ is satisfied with the gas flow regulating valve and the feed water regulating valve.

2. The cleaning method according to claim 1, wherein the dissolved gas is at least one selected from the group consisting of nitrogen gas, oxygen gas, carbon dioxide gas, hydrogen gas, ozone gas, purified air, and rare gas.

3. The cleaning method according to claim 1, wherein the cleaning liquid introduced into the jetting nozzle is prepared by dissolving the gas in pure water or ultrapure water.

4. The cleaning method according to claim 1, wherein the cleaning liquid contains at least one chemical agent selected from the group consisting of alkalis, acids, chelating agents, and surfactants.

5. The cleaning method according to claim 1, wherein the cleaning liquid contains ammonia at a concentration of 1 to 200 mg/L.

6. The cleaning method according to claim 1, wherein, in the high-pressure jet cleaning, a supply of the cleaning liquid from the nozzle is 0.5 to 30 L/min and a liquid pressure at the nozzle is 5 to 20 MPa.

7. The cleaning method according to claim 1, wherein, in the two-fluid cleaning, a supply of the cleaning liquid from the nozzle is 0.05 to 0.5 L/min, a liquid pressure at the nozzle is 0.05 to 0.5 MPa, and a carrier gas pressure at the nozzle is 0.1 to 0.6 MPa.

8. A cleaning method by two-fluid cleaning, comprising:
   supplying raw water to a degassing membrane module;
   degassing the raw water through the degassing membrane module, thereby producing degassed water;
   supplying the degassed water to a gas-dissolving membrane module and supplying a gas to a gas-phase room of the gas-dissolving membrane module, thereby producing a gas-dissolved water;
   supplying a carrier gas to the gas-dissolved water, thereby producing a mixture of the gas-dissolved water and the carrier gas;
   jetting the mixture from a jetting nozzle toward a subject of a material to be cleaned, thereby cleaning the subject; and
   controlling a pressure in a feed water piping connecting the gas-dissolving membrane module and the jetting nozzle at a predetermined pressure, thereby preventing generation of bubbles in the gas-dissolved water, wherein the gas-dissolved water contains the gas in a quantity of 1.5 to 3 times as large as a saturation solubility at the temperature of the gas-dissolved water, the gas-phase room has a gas supply piping having a gas flow regulating valve and a first pressure indicator measuring a pressure $V_1$ in the gas-phase room, the gas is supplied to the gas-phase room through the gas supply piping, the feed water piping has a feed water regulating valve and a second pressure indicator measuring a water feed pressure $V_2$ at a downstream side relative to the feed water regulating valve, and $V_1 < V_2$ is satisfied with the gas flow regulating valve and the feed water regulating valve.

9. The cleaning method according to claim 8, further comprising adding a chemical agent to the gas-dissolved water.

\* \* \* \* \*